(12) United States Patent
Jeong et al.

(10) Patent No.: US 11,990,348 B2
(45) Date of Patent: May 21, 2024

(54) WAFER PROCESSING APPARATUS AND WAFER PROCESSING METHOD USING THE SAME

(71) Applicant: SAMSUNG ELECTRONICS CO., LTD., Suwon-si (KR)

(72) Inventors: Chanyeong Jeong, Gwacheon-si (KR); Hoseop Choi, Hwaseong-si (KR); Sunggil Kang, Hwaseong-si (KR); Dongkyu Shin, Seoul (KR); Sangjin An, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 376 days.

(21) Appl. No.: 17/184,279

(22) Filed: Feb. 24, 2021

(65) Prior Publication Data

US 2022/0068659 A1     Mar. 3, 2022

(30) Foreign Application Priority Data

Aug. 28, 2020  (KR) .......................... 10-2020-0109474

(51) Int. Cl.
| | |
|---|---|
| *H01L 21/3065* | (2006.01) |
| *H01J 37/32* | (2006.01) |
| *H01L 21/311* | (2006.01) |
| *H01L 21/324* | (2006.01) |
| *H01L 21/67* | (2006.01) |

(52) U.S. Cl.
CPC .......... *H01L 21/324* (2013.01); *H01J 37/321* (2013.01); *H01J 37/32229* (2013.01); *H01J 37/3244* (2013.01); *H01J 37/32522* (2013.01); *H01J 37/32724* (2013.01); *H01L 21/31116* (2013.01); *H01L 21/67069* (2013.01); *H01L 21/67109* (2013.01)

(58) Field of Classification Search
CPC ......... H01L 21/32136; H01L 21/30655; H01L 21/3065; H01L 21/0234
See application file for complete search history.

(56) References Cited

U.S. PATENT DOCUMENTS

| | | |
|---|---|---|
| 6,916,746 B1 | 7/2005 | Hudson et al. |
| 7,029,536 B2 | 4/2006 | Hamelin et al. |
| 7,718,032 B2 | 5/2010 | Kent et al. |
| 7,955,510 B2 | 6/2011 | Arghavani et al. |
| 8,679,985 B2 | 3/2014 | Nishimura et al. |

(Continued)

FOREIGN PATENT DOCUMENTS

| | | |
|---|---|---|
| KR | 101083623 | 11/2011 |
| KR | 101895557 | 9/2018 |

(Continued)

*Primary Examiner* — Thomas T Pham
(74) *Attorney, Agent, or Firm* — Fish & Richardson P.C.

(57) ABSTRACT

A wafer processing method includes supplying a first process gas into a wafer processing apparatus, lowering a temperature of the wafer, generating plasma using the first process gas, supplying a second process gas and mixing the second process gas with the plasma, performing a plasma process on the wafer using the plasma and the second process gas, and performing an annealing process on the wafer on which the plasma process has been performed. The lowering of the temperature of the wafer includes increasing an internal pressure of the wafer processing apparatus.

17 Claims, 13 Drawing Sheets

(56) References Cited

U.S. PATENT DOCUMENTS

| | | | |
|---|---|---|---|
| 8,801,952 B1 * | 8/2014 | Wang | ............... H01L 21/31116 |
| | | | 438/723 |
| 9,087,676 B2 | 7/2015 | Katsunuma et al. | |
| 10,658,161 B2 | 5/2020 | Wang et al. | |
| 2010/0093151 A1 * | 4/2010 | Arghavani | ........ H01L 21/02057 |
| | | | 257/E21.546 |
| 2017/0345673 A1 | 11/2017 | Ranjan et al. | |
| 2020/0075313 A1 | 3/2020 | Wang et al. | |

FOREIGN PATENT DOCUMENTS

| | | |
|---|---|---|
| KR | 102003361 | 7/2019 |
| KR | 102003362 | 10/2019 |
| KR | 102044763 | 11/2019 |
| KR | 1020200022177 | 8/2020 |

* cited by examiner

WAFER PROCESSING APPARATUS AND WAFER PROCESSING METHOD USING THE SAME

CROSS-REFERENCE TO RELATED APPLICATION

A claim for priority under 35 U.S.C. § 119 is made to Korean Patent Application No. 10-2020-0109474, filed on Aug. 28, 2020, in the Korean Intellectual Property Office, the entirety of which is herein incorporated by reference.

BACKGROUND

The present disclosure relates to a wafer processing apparatus and a wafer processing method using the same, and more particularly, to an apparatus for dry-processing a wafer by using plasma and a wafer processing method using the apparatus.

As semiconductor device circuits have become more highly integrated and highly miniaturized, cleaning technology and etching technology having high etch selectivity are needed for materials such as polysilicon, silicon oxide, and silicon nitride. Wet-etching technology is excellent in its ability to remove particles, but has reduced cleaning performance due to surface tension of high aspect ratio patterns. Also, it is difficult to control selectivity for fine etching at an atomic level using wet-etching technology. Fine etching at an atomic level may be realized using dry-etching technology such as ion beam etching, but due to ion bombardment applied to a wafer for example, a damaged layer is formed after etching. Therefore, a problem or drawback of dry-etching technology such as ion beam etching is the need of subsequent processes for removing the damaged layer.

SUMMARY

Embodiments of the inventive concepts provide a wafer processing apparatus having enhanced reliability and a wafer processing method using the same.

Embodiments of the inventive concepts provide a method of manufacturing a semiconductor device including loading a wafer into a wafer processing apparatus; and processing the wafer in the wafer processing apparatus. The processing of the wafer includes supplying a first process gas into the wafer processing apparatus; lowering a temperature of the wafer; generating plasma using the first process gas; supplying a second process gas and mixing the second process gas with the plasma; performing a plasma process on the wafer using the plasma and the second process gas; and performing an annealing process on the wafer after the performing of the plasma process. The lowering of the temperature of the wafer includes increasing an internal pressure of the wafer processing apparatus.

Embodiments of the inventive concepts further provides a wafer processing method including supplying a first process gas including fluorine (F) to a wafer processing apparatus; applying radio frequency (RF) power to the first process gas to generate plasma; performing a plasma process on a wafer in the wafer processing apparatus using the plasma; and performing an annealing process on the wafer after the performing of the plasma process. The performing of the plasma process on the wafer and the performing of the annealing process on the wafer are alternately and repeatedly performed in-situ, and the performing of the annealing process on the wafer includes lowering an internal pressure of the wafer processing apparatus.

Embodiments of the inventive concepts still further provide a wafer processing method including generating plasma in a wafer processing apparatus using $NF_3$; performing a plasma process on a wafer in the wafer processing apparatus using f the generated plasma; and performing an annealing process on the wafer. The performing of the plasma process on the wafer and the performing of the annealing process on the wafer are alternately and repeatedly performed in the wafer processing apparatus. The performing of the plasma process on the wafer includes increasing an internal pressure of the wafer processing apparatus, and the performing of the annealing process on the wafer includes lowering the internal pressure of the wafer processing apparatus.

Embodiments of the inventive concepts also provide a wafer processing apparatus including a chamber body; a wafer supporter in the chamber body and configured to support a wafer; a liner on the wafer supporter and configured to define a processing region where the wafer is processed; a showerhead on the liner; a lower electrode over the showerhead and connected to a reference electric potential; an upper electrode over the lower electrode and supplied with radio frequency (RF) power; a first process gas supply device over the upper electrode and configured to supply a first process gas including fluorine (F); a pressure controller under the chamber body; a first heater on the showerhead and configured to control a temperature of the showerhead; a second heater in the liner and configured to control a temperature of the liner; a third heater in a sidewall of the chamber body and configured to control a temperature of the chamber body; and a fourth heater in the wafer supporter and configured to control a temperature of the wafer supporter. The upper electrode includes a first plate, a second plate, and a third plate arranged apart from each other in a vertical direction.

Embodiments of the inventive concepts still further provide a wafer processing apparatus including chamber body; a wafer supporter in the chamber body and configured to support a wafer; a liner on the wafer supporter and configured to define a processing region where the wafer is processed; a showerhead on the liner; a lower gas distribution structure over the showerhead; an upper gas distribution structure over the lower gas distribution structure, and configured to distribute a first process gas to a region between the upper and lower gas distribution structures; a first process gas supply device over the upper gas distribution structure and configured to supply the first process gas to the upper gas distribution structure; a pressure controller under the chamber body and configured to control an internal pressure in the chamber body; a first heater on the showerhead and configured to control a temperature of the showerhead; a second heater in the liner and configured to control a temperature of the liner; a third heater in a sidewall of the chamber body and configured to control a temperature of the chamber body; and a fourth heater in the wafer supporter and configured to control a temperature of the wafer supporter. The upper gas distribution structure includes a first plate, a second plate, and a third plate arranged apart from each other in a vertical direction.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF THE EMBODIMENTS

Hereinafter, embodiments will be described in detail with reference to the accompanying drawings. Like numeral references refer to like elements, and their repetitive descriptions are omitted.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
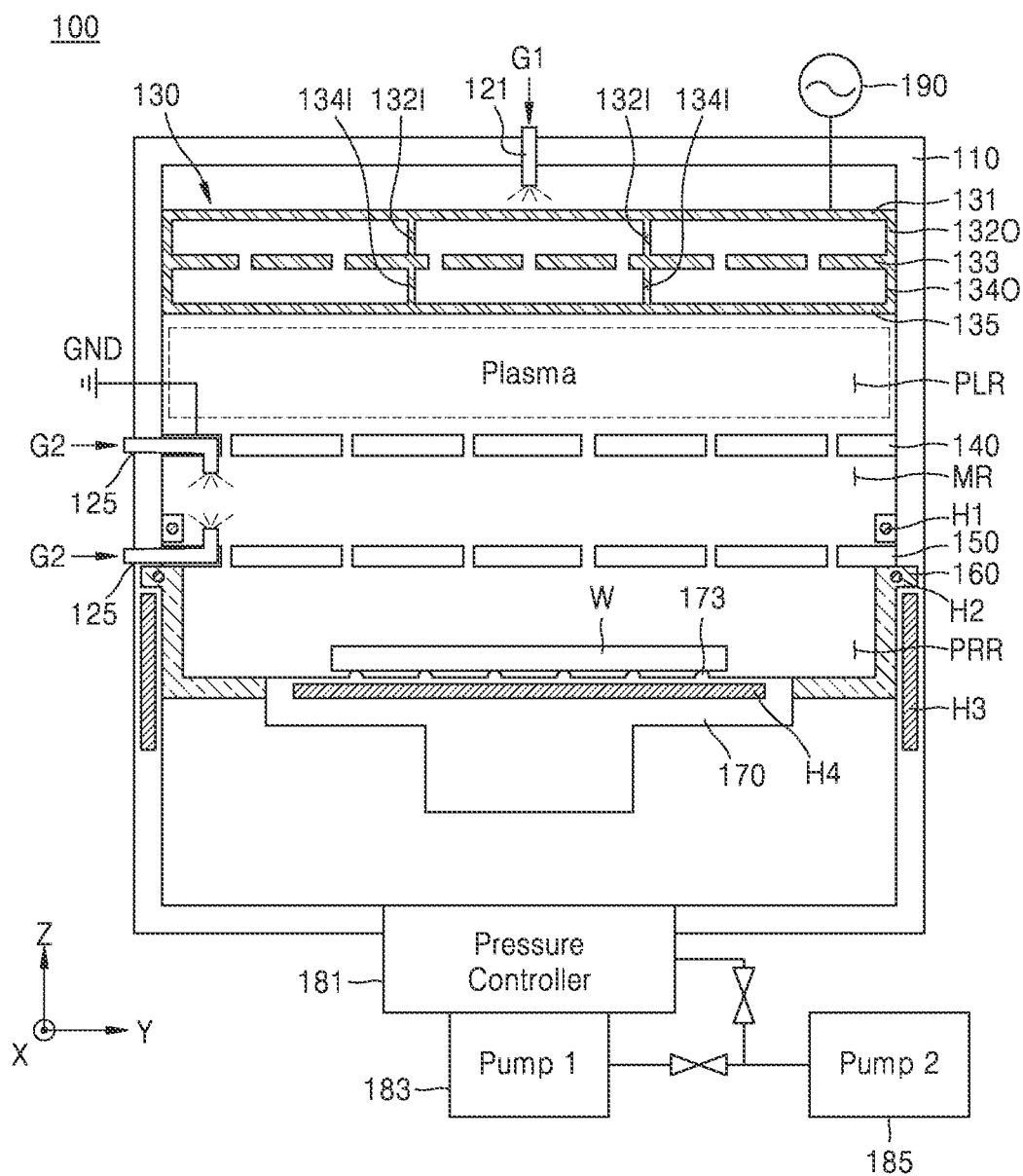
FIG. 1 illustrates a cross-sectional view of a wafer processing apparatus according to embodiments of the inventive concepts.

FIG. 1 illustrates a cross-sectional view descriptive of a wafer processing apparatus according to embodiments of the inventive concepts.

Referring to FIG. 1, the wafer processing apparatus 100 may include a chamber body 110, a first process gas supply device 121, a second process gas supply device 125, an upper electrode 130, a lower electrode 140, a showerhead 150, a liner 160, a wafer supporter 170, first to fourth heaters H1 to H4, an automatic pressure controller 181, first and second pumps 183 and 185, and a radio frequency (RF) power source 190.

The wafer processing apparatus 100 may be an apparatus which generates plasma and processes a wafer W by using the plasma. The wafer processing apparatus 100 may perform an annealing process on the wafer W. The wafer processing apparatus 100 may perform one of a wafer etching process and a wafer cleaning process.

The wafer processing apparatus 100 may perform, for example, an isotropic etching process on the wafer W. For example, the wafer processing apparatus 100 may substitute silicon oxide, formed on the wafer W, with ammonium hexa fluorosilicic acid (($NH_4$)$_2$$SiF_6$) and may perform a process of removing ($NH_4$)$_2$$SiF_6$ through annealing. As another example, the wafer processing apparatus 100 may perform a process of alternately and repeatedly performing a plasma process and an annealing process on one material of crystalline and/or amorphous silicon, silicon nitride, and metal on the wafer W to isotropically remove the one material of crystalline and/or amorphous silicon, silicon nitride, and metal.

Hereinafter, an apparatus and process of etching silicon oxide formed on the wafer W, by using process gases such as $NH_3$ (i.e., ammonia) and $NF_3$ (i.e., nitrogen trifluoride), with high etch selectivity with respect to a different material (for example, silicon nitride) will be mainly described. However, based on description given herein, those of ordinary skill in the art may easily implement an apparatus and process of etching one material of crystalline and/or amorphous silicon, silicon nitride, and metal with high etch selectivity with respect to different material selected from crystalline and/or amorphous silicon, silicon nitride, and metal.

The chamber body 110 may provide an internal space for processing the wafer W. The chamber body 110 may separate the internal space for processing the wafer W from the outside. The chamber body 110 may be clean room equipment, and may adjust a pressure and a temperature with high precision. The chamber body 110 may include a plasma region PLR where plasma is generated based on a first process gas G1, a mixture region MR where plasma and a second process gas G2 are mixed, and a processing region PRR where the wafer W is disposed. The chamber body 110 may be approximately cylindrical in shape.

A height direction of a cylinder of the chamber body 110 may be defined as a Z direction, and two directions vertical thereto may be defined as an X direction and a Y direction. The X direction and the Y direction may be perpendicular to each other.

The first process gas supply device 121 may be disposed on (or over) the upper electrode 130. The first process gas supply device 121 may supply the first process gas G1. According to some embodiments, the first process gas G1 may for example include fluorine (F). According to some embodiments, the first process gas G1 may for example include $NF_3$. According to some embodiments, the first process gas G1 may further include, for example, gas molecules such as helium (He) which do not participate in reaction. The first process gas G1 does not include hydrogen fluoride (HF). A temperature of the first process gas G1 immediately after being supplied may be room temperature (for example, about 25° C.).

Plasma etching equipment of the related art may remove silicon oxide by using an HF gas, because HF gas has good reactivity. However, special caution needs to be taken when using HF gas because it may be fatal to humans, and HF gas increases overall manufacturing costs of semiconductor devices due to its high cost.

According to embodiments of the inventive concepts, by using an $NF_3$ gas instead of HF gas, manufacturing processes may be more environmentally friendly, safety of the manufacturing processes may be improved, and manufacturing cost may be reduced.

Referring again to FIG. 1, the first process gas G1 may move to the plasma region PLR through the upper electrode 130. The upper electrode 130 may include respective first to third plates 131, 133, and 135 that apart from one another in the Z direction. According to embodiments, the first to third plates 131, 133, and 135 may be apart from one another by a predetermined distance, and thus, the first process gas G1 may be uniformly provided. For example, the first to third plates 131, 133, and 135 may be apart from one another in the Z direction so that the first process gas G1 is uniformly diffused in a space between the first to third plates 131, 133, and 135.

A first inner partition wall 132I may be disposed between the first and second plates 131 and 133, and a second inner partition wall 134I may be disposed between the second and third plates 133 and 135. Hereinafter, an example where each of the first and second inner partition walls 132I and 134I has a planar shape of approximate ring shape will be described, but this is however for convenience of description and the inventive concepts are not limited thereto. For example, the first and second inner partition walls 132I and 134I may have various planar shapes such as triangular shapes and tetragonal shapes.

The first inner partition wall 132I may separate a center space or region of a space between the first and second plates 131 and 133 from an edge space or region thereof surrounding the center space thereof. Here, the edge space may be a space between the first inner partition wall 132I and the first outer partition wall 132O. Likewise, the second inner partition wall 134I may separate a center space or region of a space between the second and third plates 133 and 135 from an edge space or region thereof surrounding the center space thereof. Here, the edge space may be a space between the second inner partition wall 134I and the second outer partition wall 134O.

Depending on positions of the first and second inner partition walls 132I and 134I, a flow rate of the first process gas G1 corresponding to a center region of the plasma region PLR and a flow rate of the first process gas G1 corresponding to an edge region of the plasma region PLR may be adjusted. For example, when the first and second inner partition walls 132I and 134I having a relatively small radius are provided (a radius of the first and second inner partition walls 132I and 134I may be understood in view of FIG. 2A for example), a flow rate of the first process gas G1 corresponding to the center region of the plasma region PLR may decrease, and a flow rate of the first process gas G1 corresponding to the edge region of the plasma region PLR may increase.

As another example, when the first and second inner partition walls 132I and 134I having a relatively large radius are provided, a flow rate of the first process gas G1 corresponding to the center region of the plasma region PLR may increase, and a flow rate of the first process gas G1 corresponding to the edge region of the plasma region PLR may decrease.

RF power may be applied to the upper electrode 130 by the RF power source 190. The first to third plates 131, 133, and 135 may be connected to one another by the first and second inner partition walls 132I and 134I and the first and second outer partition walls 132O and 134O, and may have substantially the same electric potential.

Here, a structure of each of the first to third plates 131, 133, and 135 will be respectively described in more detail with reference to FIGS. 2A to 2C.

Figure 2A:
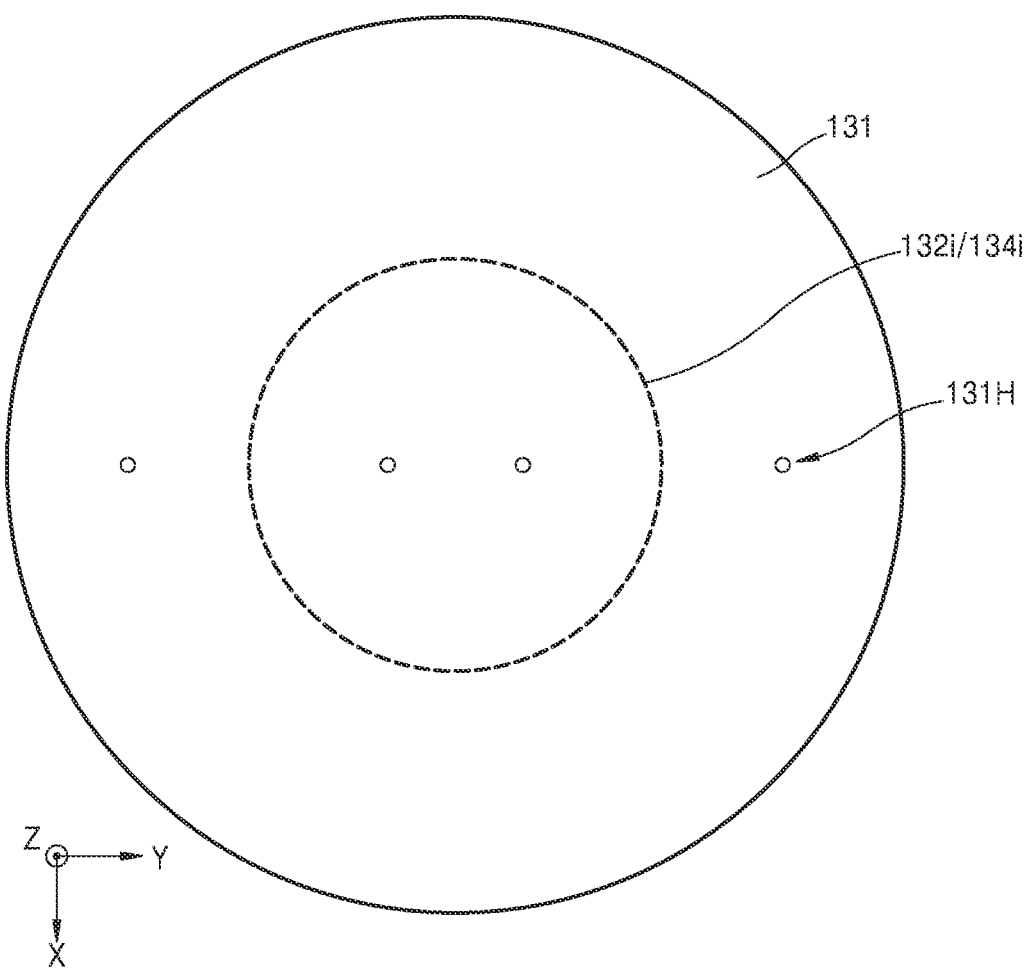
FIGS. 2A, 2B and 2C respectively illustrate plan views of first to third plates of the wafer processing apparatus according to embodiments of the inventive concepts.
Figure 2B:
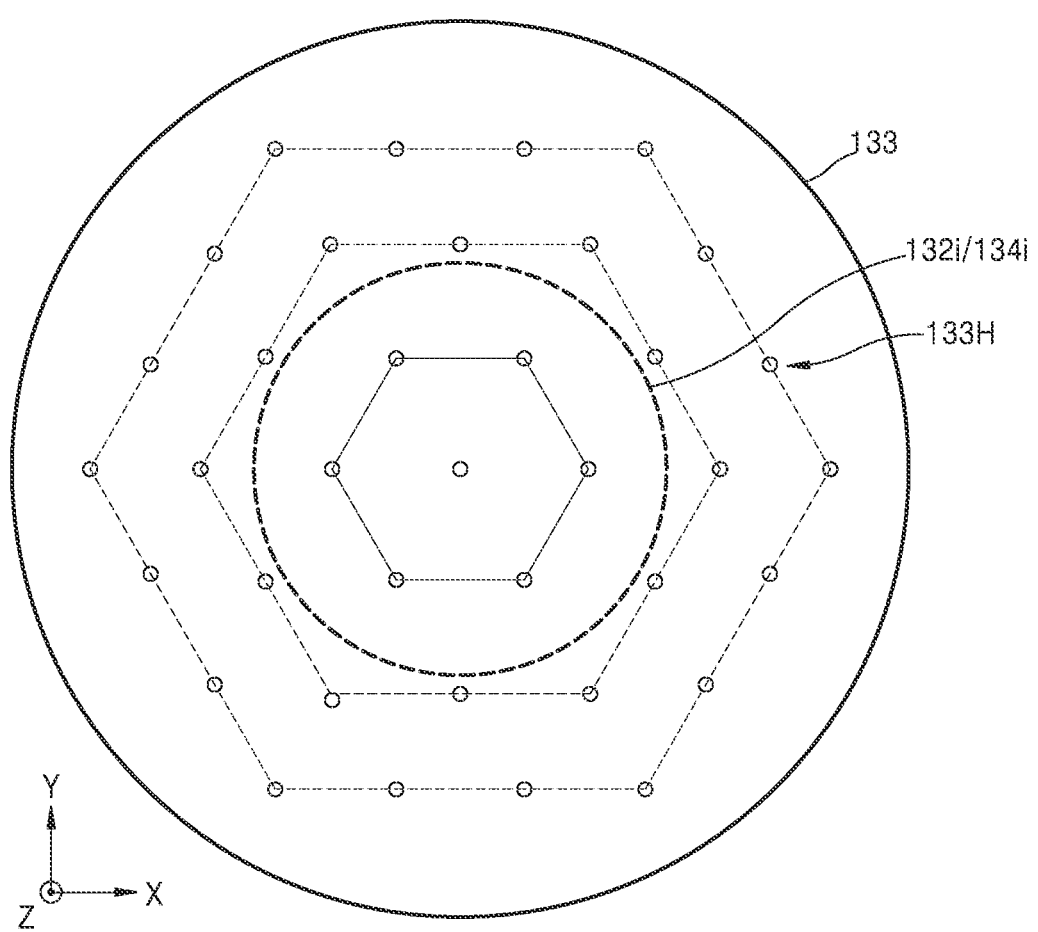
Figure 2C:
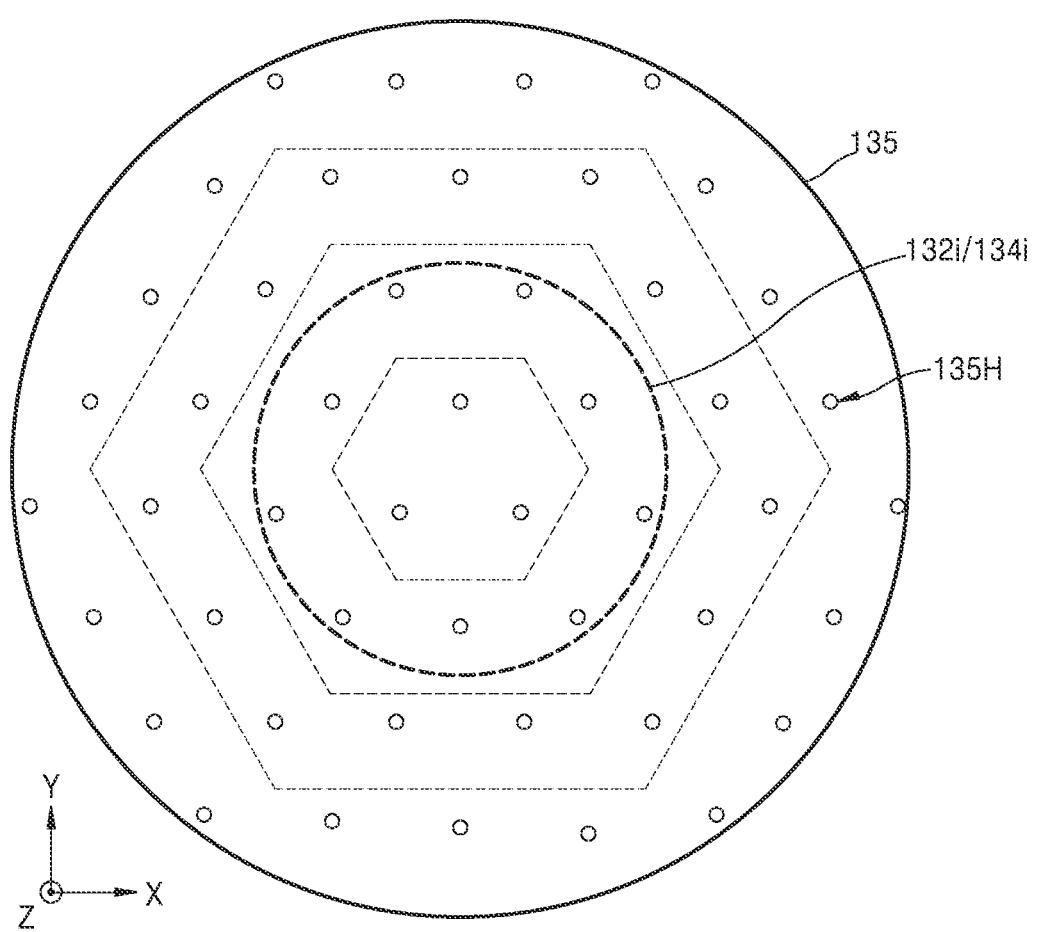

FIG. 2A illustrates a plan view of a first plate 131, FIG. 2B illustrates a plan view of a second plate 133, and FIG. 2C illustrates a plan view of a third plate 135. In FIGS. 2A to 2C, first and second inner partition walls 132I and 134I are illustrated by a broken line to assist understanding.

Referring to FIGS. 1 and 2A, the first plate 131 may include a plurality of first holes 131H acting as paths through which the first process gas G1 moves. According to some embodiments, the plurality of first holes 131H may be disposed in one row in one direction (for example, a Y direction), but are not limited thereto. Some of the plurality of first holes 131H may be disposed in a center region surrounded by the first and second inner partition walls 132I and 134I, and some other first holes 131H of the plurality of first holes 131H may be disposed outside the center region.

According to some embodiments, the number of first holes 131H disposed in the center region may be the same as the number of first holes 131H disposed outside the center region, and thus, the uniformity of the first process gas G1 may be enhanced. However, the inventive concepts are not limited thereto, and depending on the case, the number of first holes 131H disposed in the center region may differ from the number of first holes 131H disposed outside the center region.

Referring to FIGS. 1 and 2B, the second plate 133 may include a plurality of second holes 133H acting as paths through which the first process gas G1 moves. According to some embodiments, the plurality of second holes 133H may be disposed to be radially symmetric with respect to a center of the second plate 133. Some of the plurality of second holes 133H may be horizontally surrounded by first and second inner partition walls 132I and 134I. Some other second holes 133H of the plurality of second holes 133H may be horizontally interposed between the first and second inner partition walls 132I and 134I and the first and second outer partition walls 132O and 134O.

According to some embodiments, the plurality of second holes 133H may be disposed to form a honeycomb structure. The plurality of second holes 133H may be disposed at vertexes and centers of a plurality of same hexagonal shapes (illustrated by broken lines) which divide a plane of the second plate 133. In a case where the plurality of second holes 133H are disposed to form a honeycomb structure, a distance between adjacent second holes 133H of the plurality of second holes 133H may be constant (i.e., the same), and thus, the first process gas G1 may be uniformly provided to the plasma region PLR. However, the inventive concepts are not limited thereto, and the plurality of second holes 133H may be provided in arbitrary arrangement for uniformly providing the first process gas G1 to the plasma region PLR.

Referring to FIGS. 1 and 2C, the third plate 135 may include a plurality of third holes 135H acting as paths through which the first process gas G1 moves. To assist understanding, in FIG. 2C, some of hexagonal shapes defined by the plurality of third holes 135H are illustrated by a broken line. According to some embodiments, the plurality of third holes 135H may be disposed to be radially symmetric with respect to a center of the third plate 135. Some of the plurality of third holes 135H may be horizontally surrounded by first and second inner partition walls 132I and 134I. Some other third holes 135H of the plurality of third holes 135H may be horizontally interposed between the first and second inner partition walls 132I and 134I and first and second outer partition walls 132O and 134O.

Referring to FIGS. 1, 2B, and 2C, like the plurality of second holes 133H, each of the plurality of third holes 135H may form a honeycomb structure, and the plurality of third holes 135H do not overlap with the plurality of second holes 133H in a Z direction. Each of the plurality of third holes 135H may be horizontally apart from the plurality of second holes 133H (for example, in an X direction and a Y direction). From a projective or plan view, each of the plurality of second holes 133H in the second plate 133 may be disposed at a center of three third holes 135H in the third plate 135 that are horizontally adjacent to one another. Horizontal distances to three third holes 135H horizontally closest to one of the plurality of second holes 133H may be substantially the same. For example, in a projective or plan view, each of the plurality of second holes 133H may be disposed at a center of three third holes 135H disposed in a triangular shape. Therefore, the first process gas G1 passing through the second holes 133H will not directly be provided to the plasma region PLR through the third holes 135H, but will first be uniformly diffused along the X and Y directions between the second and third plates 133 and 135, and then will be provided to the plasma region PLR through the third holes 135H, so that the first process gas G1 may be uniformly provided to the plasma region PLR.

Also, it is illustrated that the second plate 133 includes 37 second holes 133H and the third plate 135 includes 48 third holes 135H, but this is merely an example and the inventive concepts are not limited thereto. For example, each of the second plate 133 and the third plate 135 may include hundreds to thousands of holes acting as a path for the first process gas G1.

Referring again to FIG. 1, the lower electrode 140 may be disposed under the upper electrode 130. The upper electrode 130 and the lower electrode 140 may define the plasma region PLR where plasma is generated. The plasma region PLR may be a region disposed between the upper electrode 130 and the lower electrode 140. The plasma region PLR may be a region where plasma is generated. A reference electric potential GND may be applied to the lower electrode 140. Therefore, RF power may be applied to the first process gas G1 provided between the upper electrode 130 and the lower electrode 140, and thus, plasma may be generated.

The showerhead 150 may be disposed under the lower electrode 140. The showerhead 150 and the lower electrode 140 may define the mixture region MR. The plasma may be diffused to the mixture region MR. The second process gas supply device 125 may supply the second process gas G2 to the mixture region MR. According to some embodiments, the second process gas G2 may include hydrogen (H). According to some embodiments, the second process gas G2 may include $NH_3$. A temperature of the second process gas G2 immediately after being supplied may be room temperature (for example, about 25° C.).

The first heater H1 may be disposed on the showerhead 150. The first heater H1 may have a ring shape which extends along an inner wall surface of the chamber body 110 approximately. The first heater H1 may contact the showerhead 150. According to some embodiments, the first heater H1 may control a temperature of the showerhead 150. According to some embodiments, the first heater H1 may maintain the temperature of the showerhead 150 as a predetermined temperature. According to some embodiments, the temperature of the showerhead 150 may be maintained within a range of about 120° C. to about 300° C. The temperature of the showerhead 150 may be higher than a sublimation temperature (for example, about 110° C.) of a by-product formed by processing of the wafer W.

As a plasma process and an annealing process are performed on the wafer W, the showerhead 150 may become polluted, and thus may be periodically cleaned. According to embodiments, the first heater H1 may be detachable from the showerhead 150 and may be provided on the showerhead 150. Thus, the structure of the showerhead 150 may be simplified, and the showerhead 150 may be easily cleaned.

The liner 160 may be disposed under the showerhead 150. The liner 160 and the showerhead 150 may define the process region PRR where the wafer W is processed. A mixture of the plasma and the first and second process gases G1 and G2 may be diffused to the process region PRR through the showerhead 150. The wafer W may be processed by the mixture of the plasma and the first and second process gases G1 and G2.

The liner 160 may define a lower portion and a sidewall of the process region PRR. The second heater H2 may be embedded into the liner 160. The second heater H2 may control a temperature of the liner 160. The second heater H2 may maintain the temperature of the liner 160 as a predetermined temperature. The temperature of the liner 160 may be higher than a sublimation temperature (for example, about 110° C.) of a by-product result from processing of the wafer W. The temperature of the liner 160, for example, may be maintained within a range of about 120° C. to about 300° C. The liner 160 may include a plurality of slit structures (not shown) formed on a bottom surface thereof. A mixture of the plasma and the first and second process gases G1 and G2 may flow from the process region PRR to a lower portion of the chamber body 110 through the plurality of slit structures.

The wafer supporter 170 may support the wafer W. The wafer supporter 170, the liner 160 and the showerhead 150 may configure a boundary of the process region PRR. A plurality of protrusion structures 173 may be formed in a top surface of the wafer supporter 170 and may decrease a contact area between the wafer W and the wafer supporter 170.

The third heater H3 may be disposed in a sidewall of the chamber body 110. The third heater H3 may surround a side surface of the process region PRR. The third heater H3 may extend in the Z direction. A portion of the third heater H3 may be disposed above a top surface of the wafer supporter 170 to surround the process region PRR. Another portion of the third heater H3 may be disposed under the top surface of the wafer supporter 170. The third heater H3 may control a temperature of a portion of the chamber body 110 surrounding the process region PRR. The third heater H3 may maintain the temperature of the portion of the chamber body 110 surrounding the process region PRR. The temperature of the portion of the chamber body 110 surrounding the process region PRR may be maintained within, for example, a range of about 20° C. to about 105° C. The temperature of the portion of the chamber body 110 surrounding the process region PRR may be lower than a temperature of the liner 160, but is not limited thereto. The chamber body 110 surrounding the process region PRR may be maintained at a relatively high temperature by the third heater H3 so that the process region PRR is not directly exposed to a room-temperature environment, and thus a temperature of the process region PR may be more precisely controlled.

The fourth heater H4 may be inserted into the wafer supporter 170. The fourth heater H4 may control a temperature of the wafer supporter 170. The fourth heater H4 may maintain the temperature of the wafer supporter 170 at a predetermined temperature. The temperature of the wafer supporter 170 may be higher than a sublimation temperature (for example, about 110° C.) of a by-product result from processing of the wafer W. The temperature of the wafer supporter 170, for example, may be maintained within a range of about 20° C. to about 105° C.

The pressure controller 181 and the first and second pumps 183 and 185 connected to the pressure controller 181 may be disposed under the chamber body 110. The pressure controller 181 may control an internal pressure of the wafer processing apparatus 100 on the basis of external control signals. The pressure controller 181 may control each of valves connected to the first and second pumps 183 and 185 on the basis of the external control signals. According to embodiments, the pressure controller 181 may include a memory, which stores commands for controlling the valves connected to the first and second pumps 183 and 185, and a processor which performs processes responsive to the commands stored in the memory or the external control signals. The memory and the processor may be implemented as hardware, firmware, software, or an arbitrary combination thereof. For example, the processor may include a computing device such as workstation computer, a desktop computer, a laptop computer, or a tablet computer. The memory and the processor may include a complicated processor such as a simple controller, a microprocessor, a central processing unit (CPU), or a graphics processing unit (GPU), a processor configured by software, dedicated hardware, or firmware. The memory and the processor may be implemented by, for example, a general-use computer or application specific hardware such as a digital signal processor (DSP), field programmable gate arrays (FPGAs), or application specific integrated circuits (ASICs).

According to some embodiments, operations of the memory and the processor may be implemented as instructions stored in a machine-readable medium which is read and executed by one or more processors. Here, the machine-readable medium may include an arbitrary mechanism for storing and/or transmitting information in a form readable by a machine (for example, a computing device). For example, the machine-readable medium may include read only memory (ROM), random access memory (RAM), a magnetic disk storage medium, an optical storage medium, flash memory devices, electrical/optical/acoustic/another type radio signals (for example, a carrier, an infrared signal, a digital signal, etc.), and other arbitrary signals.

Firmware, software, routine, and instructions for performing the operations of the memory and the processor described above or an arbitrary process described below may be provided. For example, the memory and the processor may be implemented by software which generates a signal for controlling an internal pressure of the wafer processing apparatus 100. However, this is for convenience of description, and the operations of the memory and the processor described above may be based on a computing device, a processor, a controller, or another device which executes firmware, software, routines, and instructions.

The first pump 183 may include a turbo molecular pump. The turbo molecular pump may be a vacuum pump type similar to a turbo pump and may secure and maintain vacuum. The turbo molecular pump may include, for example, a fan rotor which rotates quickly. The turbo molecular pump may control a magnitude and a direction of a momentum of gas molecules by using the fan rotor to provide a high vacuum pressure.

The second pump 185 may include a dry pump. The dry pump, unlike an oil diffusion pump, may not include oil which performs a sealing and lubricating function for maintaining vacuum formed in a process chamber. The dry pump may provide vacuum of about $10^{-2}$ mbar and may be high in vacuum cleanliness. The dry pump may include, for example, one of a claw pump, a multi stage roots pump, a roots and claw combination pump, a scroll pump, a screw pump, a diaphragm pump, and a molecular drag pump.

Figure 3:
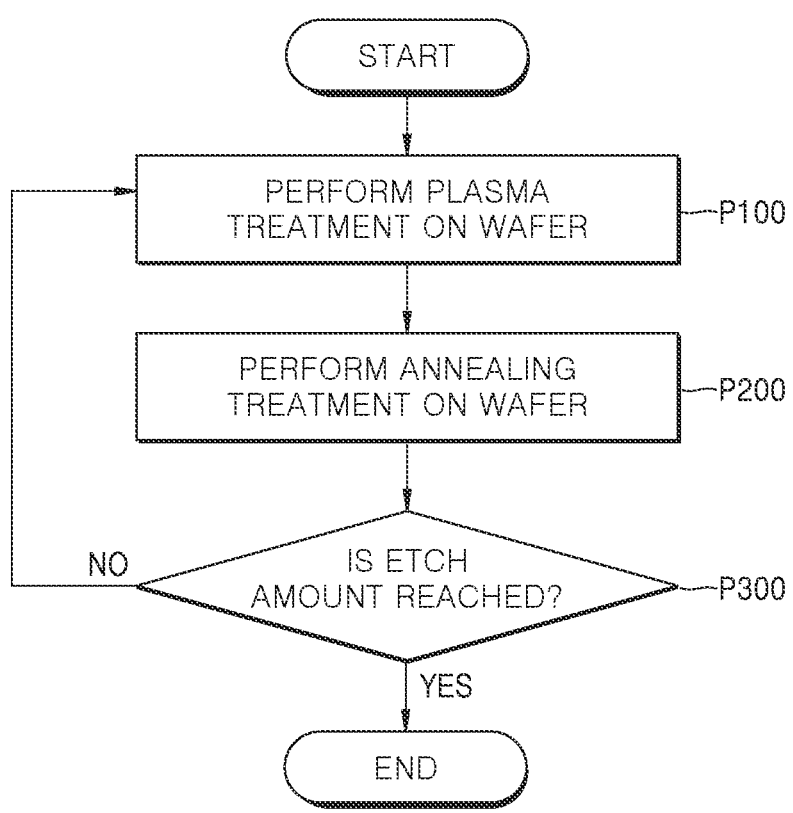
FIG. 3 illustrates a flowchart descriptive of a wafer processing method according to embodiments of the inventive concepts.

FIG. 3 illustrates a flowchart descriptive of a wafer processing method according to embodiments of the inventive concepts.

Figure 4:
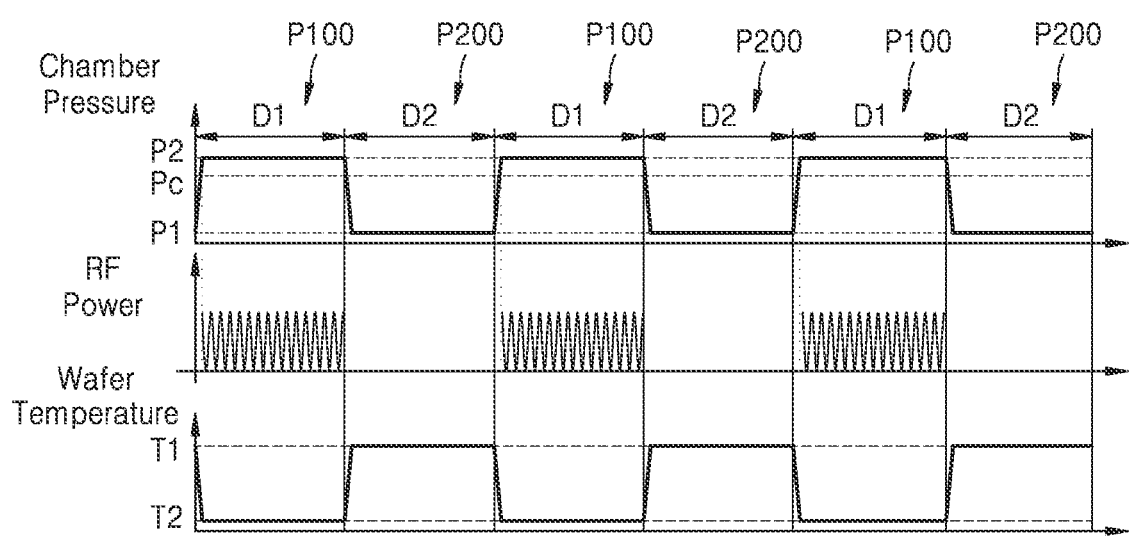
FIG. 4 illustrates a graph descriptive of a wafer processing method according to embodiments of the inventive concepts.

FIG. 4 illustrates a graph descriptive of a wafer processing method according to embodiments of the inventive concepts. In more detail, FIG. 4 shows an internal pressure of the wafer processing apparatus 100, RF power, and a temperature of a wafer with respect to a time in a plasma process.

Referring to FIGS. 1, 3, and 4, the process performed on a wafer W according to embodiments of the inventive concepts includes operation P100 of performing a plasma process on the wafer W, and operation P200 of performing an annealing process on the wafer W.

After operation P200 of performing an annealing process on the wafer W is performed, when an etch target (for example, silicon oxide on the wafer W) is etched by an etch target amount (yes) in operation P300, wafer processing by the wafer processing apparatus 100 may end, and the wafer W may be unloaded from the wafer processing apparatus 100. When an etch amount of an etch target material film is less than the etch target amount (no) in P300, a plasma process may be again performed on the wafer W in operation P100. Therefore, operation P100 of performing the plasma process on the wafer W and operation P200 of performing the annealing process on the wafer W may be alternately and repeatedly performed as illustrated in FIGS. 3 and 4. Operation P100 of performing the plasma process on the wafer W and operation P200 of performing the annealing process on the wafer W may be continuously performed alternately in-situ in the wafer processing apparatus 100 without a process of transporting the wafer W to separate equipment. For example, operations P100 and P200 may be performed in the same chamber.

A wafer processing apparatus of the related art removes silicon oxide on a wafer and moves the wafer to separate annealing equipment, and then performs an annealing process in the annealing equipment to remove a by-product formed on the wafer. In such a process, because two pieces of equipment are needed, the complexity of equipment increases, and because the wafer has to be moved between different equipment, the productivity of manufacturing products is reduced. However, according to embodiments of the inventive concepts, because separate equipment for performing the annealing process on the wafer W after the plasma process is performed on the wafer W is not needed, equipment investment cost may be reduced. Also, time necessary for transporting the wafer W may be saved, and thus the productivity of the wafer processing apparatus 100 may be enhanced.

While the plasma process is being performed on the wafer W in operation P100, a pressure of the wafer processing apparatus 100 may increase from a first pressure P1 to a second pressure P2.

The plasma process performed in operation P100 may be substantially performed at the second pressure P2. The plasma process of operation P100 being substantially performed at the second pressure P2 may denote that internal pressure of the wafer processing apparatus 100 is substantially maintained as the second pressure P2 while plasma is generated and the wafer W is being processed by the plasma. Hereinafter, description of a condition for performing certain processes may have meaning similar to descriptions of operation P100 and the second pressure P2 described above.

While the annealing process is being performed on the wafer W in operation P200, an internal pressure of the wafer processing apparatus 100 may decrease from the second pressure P2 to the first pressure P1. The annealing process performed in operation P200 may be substantially performed at the first pressure P1.

According to some embodiments, the first pressure P1 may be less than or equal to 0.1 Torr. According to some embodiments, the second pressure P2 may be maintained within a range of about 0.1 Torr to about 10 Torr. According to some embodiments, the second pressure P2 may be maintained within a range of about 10 to about 10,000 times the first pressure P1.

While the plasma process is being performed on the wafer W in operation P100, a temperature of the wafer W may decrease from a first temperature T1 to a second temperature T2. While the annealing process is being performed on the wafer W in operation P200, the temperature of the wafer W may increase from the second temperature T2 to the first temperature T1. The plasma process of operation P100 may be substantially performed at the second temperature T2, and the annealing process of operation P200 may be substantially performed at the first temperature T1. According to some embodiments, the second temperature T2 may be maintained within a range of about 25° C. to about 110° C. According to some embodiments, the first temperature T1 may be maintained within a range of about 110° C. to about 300° C.

In at least a portion of a period where the plasma process is performed on the wafer W in operation P100 the RF power may be in a turned-on state, and while the annealing process is being performed on the wafer W in operation P200 the RF power may be in a turned-off state.

Hereinafter, an effect of plasma process according to embodiments will be described with reference to FIG. 11.

Figure 11:
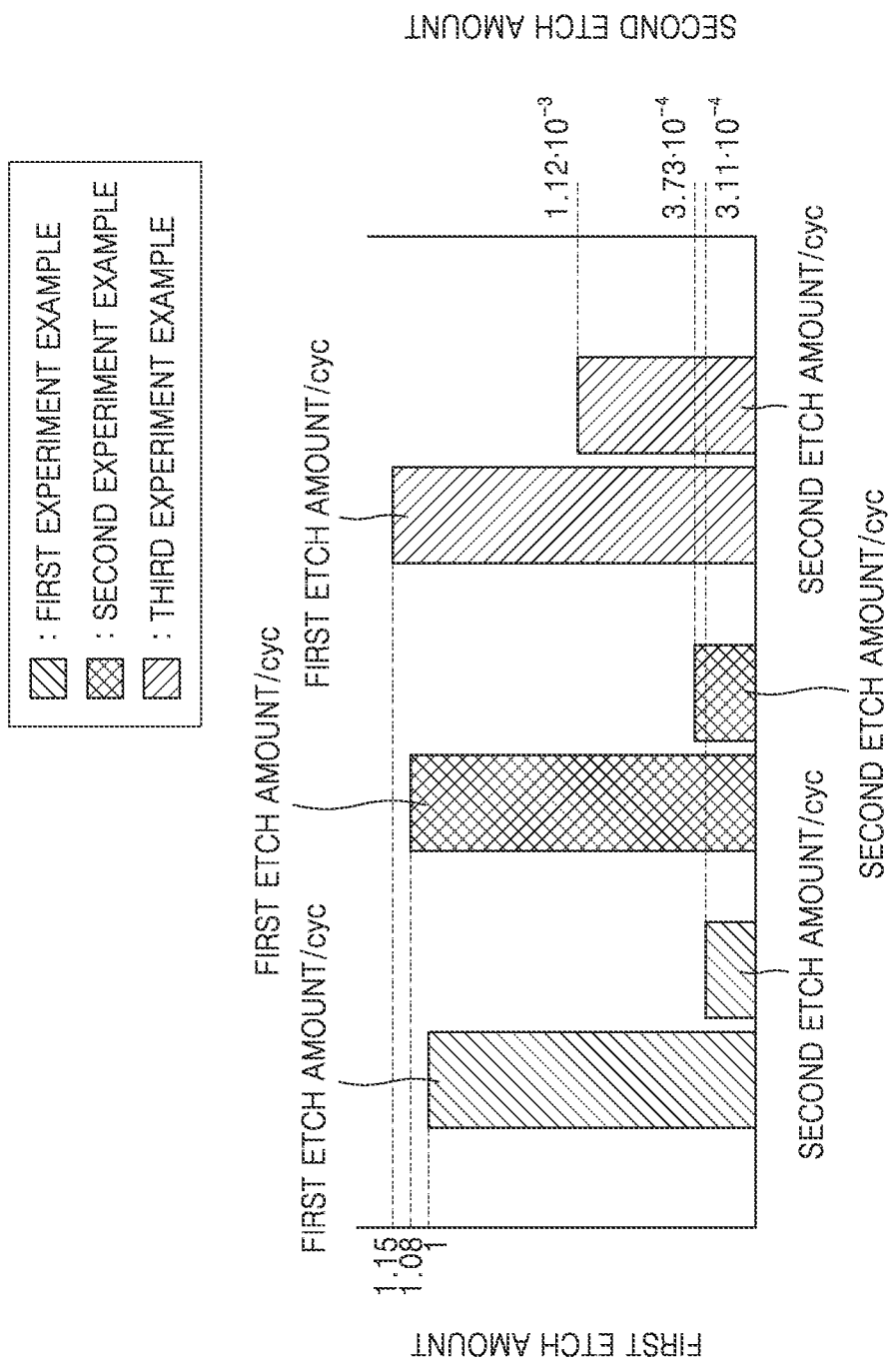
FIG. 11 illustrates a graph descriptive of an effect of plasma process according to embodiments of the inventive concepts.

FIG. 11 illustrates a graph descriptive of an effect of a plasma process according to embodiments of the inventive concepts. In more detail, FIG. 11 is a graph showing variations of a first etch amount/cyc of silicon oxide and a second etch amount/cyc of silicon nitride, with respect to a variation of a level of the RF power supplied by the RF power source 190 for generating plasma. In FIG. 11 and as disclosed herein, the term "cyc" should be understood to be mean "cycle". Here, an etch amount per cycle may represent the amount of material etched during one cycle including one plasma process and one annealing process. In FIG. 11, in a case where the power supplied by the RF power source 190 is standardized to 1 in a second experiment example, the power supplied by the RF power source 190 may be about 0.75 in a first experiment example, and the power supplied by the RF power source 190 may be about 1.25 in a third experiment example. In the graph of FIG. 11, the ordinate axis represents etch amount by material of each experiment example, and each magnitude of etch amount was standardized so that a magnitude of a first etch amount/cyc of the first experiment example is 1. The ordinate axis of a left region represents a first etch amount/cyc, and the ordinate axis of a right region represents a second etch amount/cyc.

Referring to FIG. 11, it has been confirmed that, as a level of the RF power increases, the amount of generated plasma increases, and thus, each of first and second etch amounts increases. On the other hand, it may be confirmed that, as a level of the RF power decreases, an etch speed decreases, but an etch selectivity increases. For example, it has been confirmed that an etch selectivity of the first experiment is 3210, an etch selectivity of the second experiment is 2900, and an etch selectivity of the third experiment is 1022. According to embodiments, by adjusting a level of the RF power source 190, an etching process may be performed during a high etch speed, or an etching process may be performed with a high etch selectivity during a low etch speed. According to embodiments, an etch speed and an etch selectivity may be controlled based on the RF power source 190, and thus, controllability of a plasma process may be enhanced.

Referring to FIG. 4, a length of a second time D2 for which the annealing process is performed on the wafer W in operation P200 may be greater than or equal to that of a first time D1 for which the plasma process is performed on the wafer W in operation P100. According to some embodiments, the length of each of the first and second times D1 and D2 may be about several seconds. In operation P100 a material film (for example, silicon oxide) formed on the wafer W may be substituted with $(NH_4)_2SiF_6$, and in operation P200 $(NH_4)_2SiF_6$ may be removed through a thermal process.

When a duration time of the plasma process of operation P100 is shorter than that of the annealing process of operation P200, a by-product (for example, $(NH_4)_2SiF_6$) may not effectively be removed, and due to this, an etch selectivity may be lowered. According to embodiments, the length of the second time D2 may be set to be greater than or equal to a length of the first time D1, and thus, a high etch selectivity may be secured.

For example, an operation of controlling an internal pressure of the wafer processing apparatus 100 described in operations P100 and P200 may be performed by the pressure controller 181, and a temperature of the wafer W may depend on a variation of the internal pressure of the wafer processing apparatus 100 by the pressure controller 181. Therefore, the temperature of the wafer W may be controlled by the internal pressure of the wafer processing apparatus 100.

Figure 5:
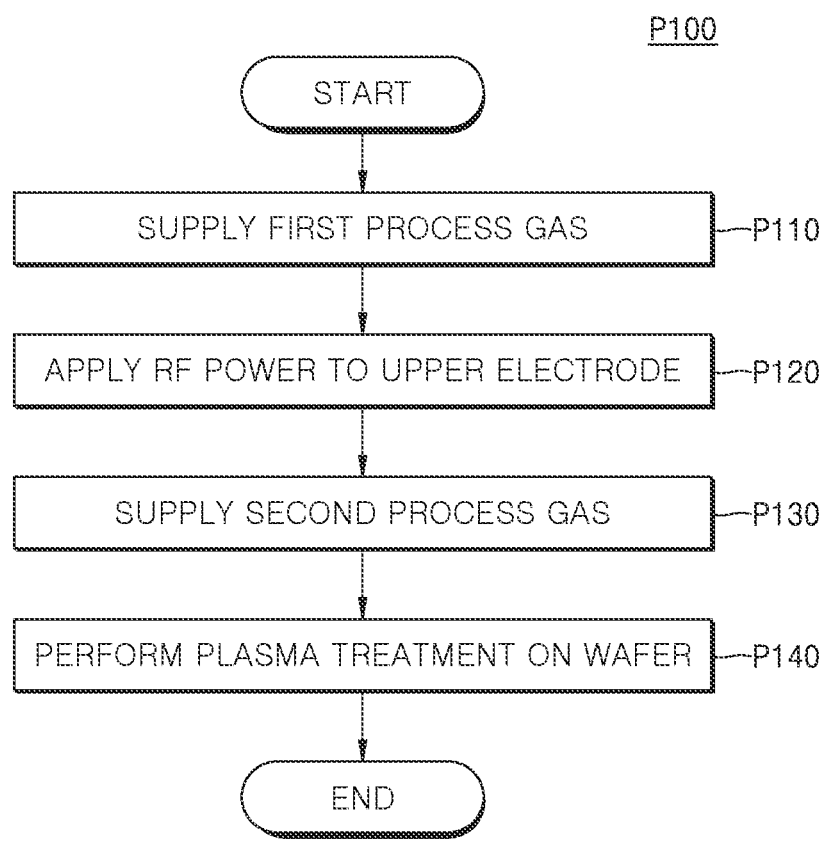
FIG. 5 illustrates a flowchart descriptive of an operation of performing a plasma process according to embodiments of the inventive concepts.

FIG. 5 illustrates a flowchart descriptive of an operation of performing the plasma process of operation P100 according to embodiments of the inventive concepts.

Figure 6:
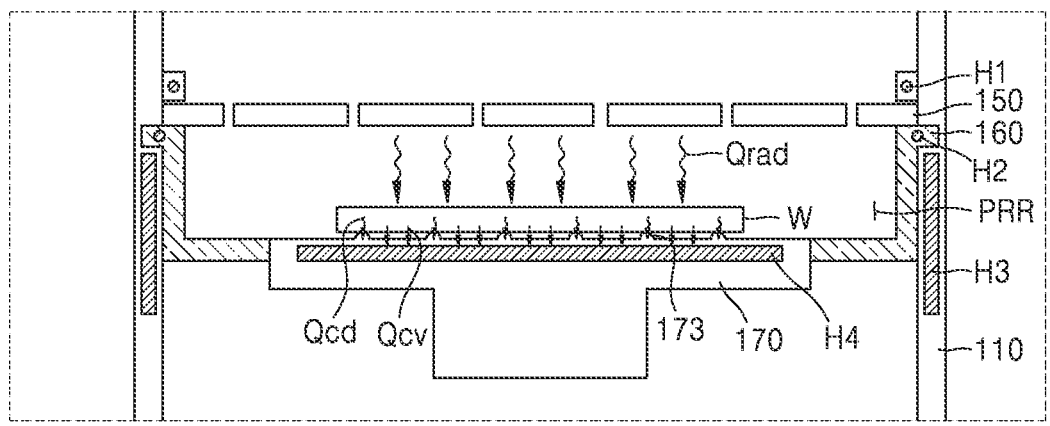
FIG. 6 illustrates a partial cross-sectional view of a region of the wafer processing apparatus of FIG. 1, descriptive of a plasma process and an annealing process according to embodiments of the inventive concepts.

FIG. 6 illustrates a partial cross-sectional view of a region of wafer processing apparatus 100 of FIG. 1 descriptive of the plasma process of operation P100 and the annealing process of operation P200.

Referring to FIG. 5, the plasma process of operation P100 may include operation P110 of supplying a first process gas, operation P120 of applying RF power to an upper electrode to generate plasma from the first process gas, operation P130 of supplying a second process gas, and operation P140 of performing an etching process on a wafer by using the plasma.

Referring to FIGS. 1 and 4 to 6, in operation P110, the first process gas supply device 121 may supply the first process gas G1 to the wafer processing apparatus 100. As illustrated in detail in FIG. 6, a temperature of a wafer W may be determined based on radiant heat Qrad from the showerhead 150, convective heat Qcv by an internal atmosphere of the wafer processing apparatus 100, and conductive heat Qcd by the wafer supporter 170.

In operation P110, as the first process gas G1 is supplied, an internal pressure of the wafer processing apparatus 100 may increase from the first pressure P1 to the second pressure P2. As the internal pressure of the wafer processing apparatus 100 increases, the heat loss of the wafer W caused by the convective heat Qcv by the internal atmosphere of the wafer processing apparatus 100 may be greater than the heat of the wafer W obtained or gained by the radiant heat Qrad from the showerhead 150.

According to some embodiments, a temperature of the internal atmosphere of the wafer processing apparatus 100 may be maintained within a range of about 25° C. to about 100° C. Therefore, the temperature of the wafer W may decrease to the second temperature T2.

Operation P120 of generating the plasma from the first process gas G1 may include an operation of applying the RF power to the upper electrode 130 by using the RF power source 190. According to some embodiments, the wafer processing apparatus 100 may include a pressure sensor. According to some embodiments, when the internal pressure of the wafer processing apparatus 100 is greater than or equal to threshold pressure Pc (see FIG. 4), the wafer processing apparatus 100 may apply the RF power to the upper electrode 130 by using the RF power source 190.

In more detail, when the internal pressure of the wafer processing apparatus 100 reaches the threshold pressure Pc, the RF power may be placed in a turned-on state. Therefore, the RF power may maintain a turned-off state before the first process gas G1 is sufficiently provided, and thus, power consumption may be reduced. However, the inventive concepts are not limited thereto, and the application of the RF power by the RF power source 190 and the supply of the first process gas G1 may be performed substantially simultaneously.

In operation P130, the second process gas supply device 125 may supply the second process gas G2 to the inside of the wafer processing apparatus 100. According to some embodiments, the second process gas G2 may be provided substantially simultaneously with the application of the RF power by the RF power source 190. According to some other embodiments, the second process gas G2 may be provided after a predetermined time elapses from the application of the RF power by the RF power source 190. According to some other embodiments, the second process gas G2 may be provided substantially simultaneously with the first process gas G1.

Subsequently, in operation P140, an etching process may be performed on the wafer W. The etching process may be performed based on the plasma generated in operation P120 and the second process gas G2 supplied in operation P130. The plasma generated in operation P120 and the second process gas G2 supplied in operation P130 may react with silicon oxide on the wafer W to generate $(NH_4)_2SiF_6$, in accordance with the following Formula 1.

$$SiO_{2(s)}+2NF_{3(g)}+4NH_{3(g)} \rightarrow (NH_4)_2SiF_{6(s)}+2H_2O_{(g)}+2N_{2(g)}$$ [Formula 1]

A chemical reaction in accordance with Formula 1 may be more actively performed in a low temperature, and thus, the wafer processing apparatus 100 according to embodiments may effectively process the wafer W.

Figure 7:
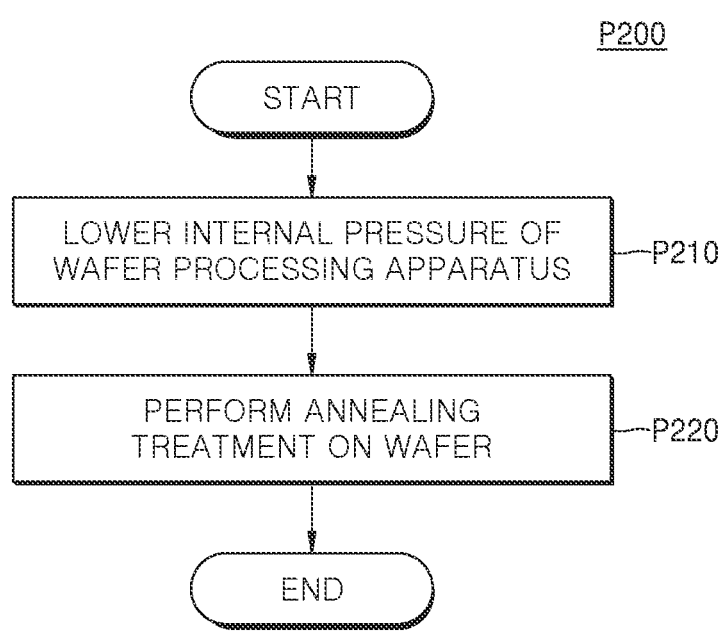
FIG. 7 illustrates a flowchart descriptive of an operation of performing an annealing process according to embodiments of the inventive concepts.

FIG. 7 illustrates a flowchart descriptive of an operation of performing the annealing process of operation P200 according to embodiments of the inventive concepts.

Referring to FIGS. 1, 4, 6, and 7, operation P200 may include operation P210 of decreasing the internal pressure of the wafer processing apparatus 100 and operation P220 of performing an annealing process on a wafer. In operation P210, an operation of decreasing the internal pressure of the wafer processing apparatus 100 may be performed by the pressure controller 181. In operation P210, the first process gas G1 and the second process gas G2 are not be provided to the wafer processing apparatus 100.

In operation P210, the internal pressure of the wafer processing apparatus 100 may decrease from the second pressure P2 to the first pressure P1, the heat obtainment (or gain) by the wafer W by the radiant heat Qrad from the showerhead 150 may be greater than heat loss caused by the conductive heat Qcd by the wafer supporter 170 and the heat loss of the wafer W caused by convective heat Qcv by the internal atmosphere of the wafer processing apparatus 100. Therefore, the temperature of the wafer W may increase from the second temperature T2 to the first temperature T1.

As the temperature of the wafer W increases to the first temperature T1, an annealing process may be performed on the wafer W in operation P220. $(NH_4)_2SiF_6$ generated in operation P100 may be removed by the annealing process of operation P220 on the basis of the following Formula 2.

$$(NH_4)_2SiF_{6(s)} \rightarrow SiF_{4(g)}+2NH_{3(g)}+2HF_{(g)}$$ [Formula 2]

Figure 8:
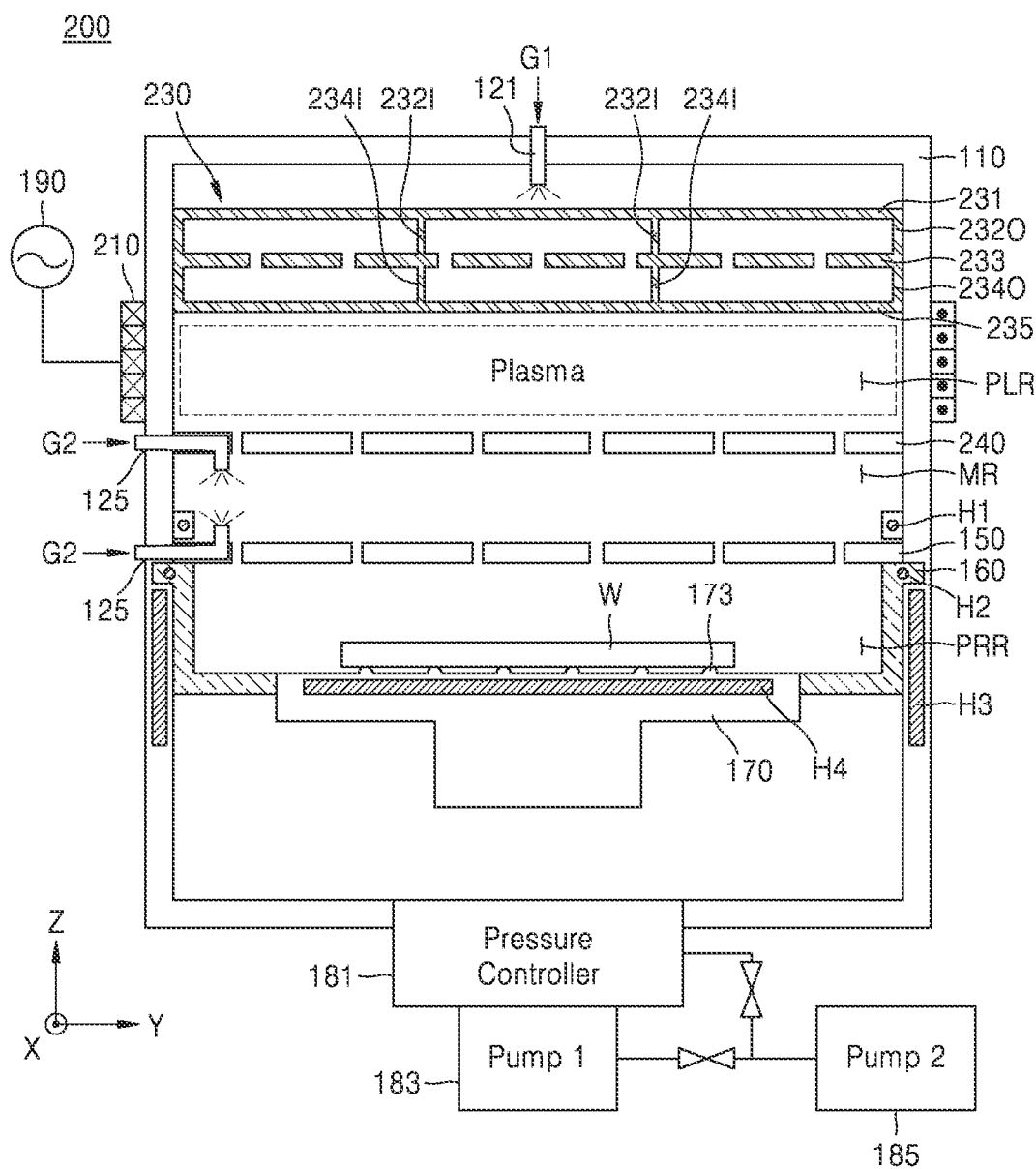
FIG. 8 illustrates a schematic cross-sectional view of a wafer processing apparatus according to other embodiments of the inventive concepts.

FIG. 8 illustrates a schematic cross-sectional view descriptive of a wafer processing apparatus 200 according to other embodiments of the inventive concepts.

For convenience, description which is the same as or similar to description provided with reference to FIGS. 1 to 2C is omitted, and the following description will mainly focus on differences between the embodiments of FIGS. 1 to 2C and FIG. 8.

Referring to FIG. 8, the wafer processing apparatus 200 may include a chamber body 110, a first process gas supply device 121, a second process gas supply device 125, an inductive device 210, first and second gas distribution structures 230 and 240, a showerhead 150, a liner 160, a wafer supporter 170, first to fourth heaters H1 to H4, an automatic pressure controller 181, first and second pumps 183 and 185, and an RF power source 190.

The wafer processing apparatus 100 may include inductively coupled plasma (ICP) equipment. The wafer processing apparatus 200 of FIG. 8 is similar to the wafer processing apparatus 100 of FIG. 1, but does not include the upper electrode 130 and the lower electrode 140 as shown in FIG. 1 and additionally includes the first and second gas distribution structures 230 and 240 and the inductive device 210.

The first (i.e., upper) gas distribution structure 230 may include first to third plates 231, 233, and 235 apart from one another in a Z direction, and first and second inner partition walls 2321 and 2341, and first and second outer partition walls 2320 and 2340 therebetween. The first gas distribution structure 230 may have a structure similar to the upper electrode 130 of FIG. 1, but RF power is not applied thereto. The first process gas G1 may be uniformly provided to the plasma region PLR by the first gas distribution structure 230.

The second (i.e., lower) gas distribution structure 240 may have a structure similar to the lower electrode 140 of FIG. 1, but a reference electric potential is not applied thereto.

The inductive device 210 may horizontally surround the plasma region PLR. The inductive device 210 may include, for example, a coil. The RF power source 190 may provide RF power to the inductive device 210. The inductive device 210 may generate plasma on the basis of the RF power and the first process gas G1.

Figure 9:
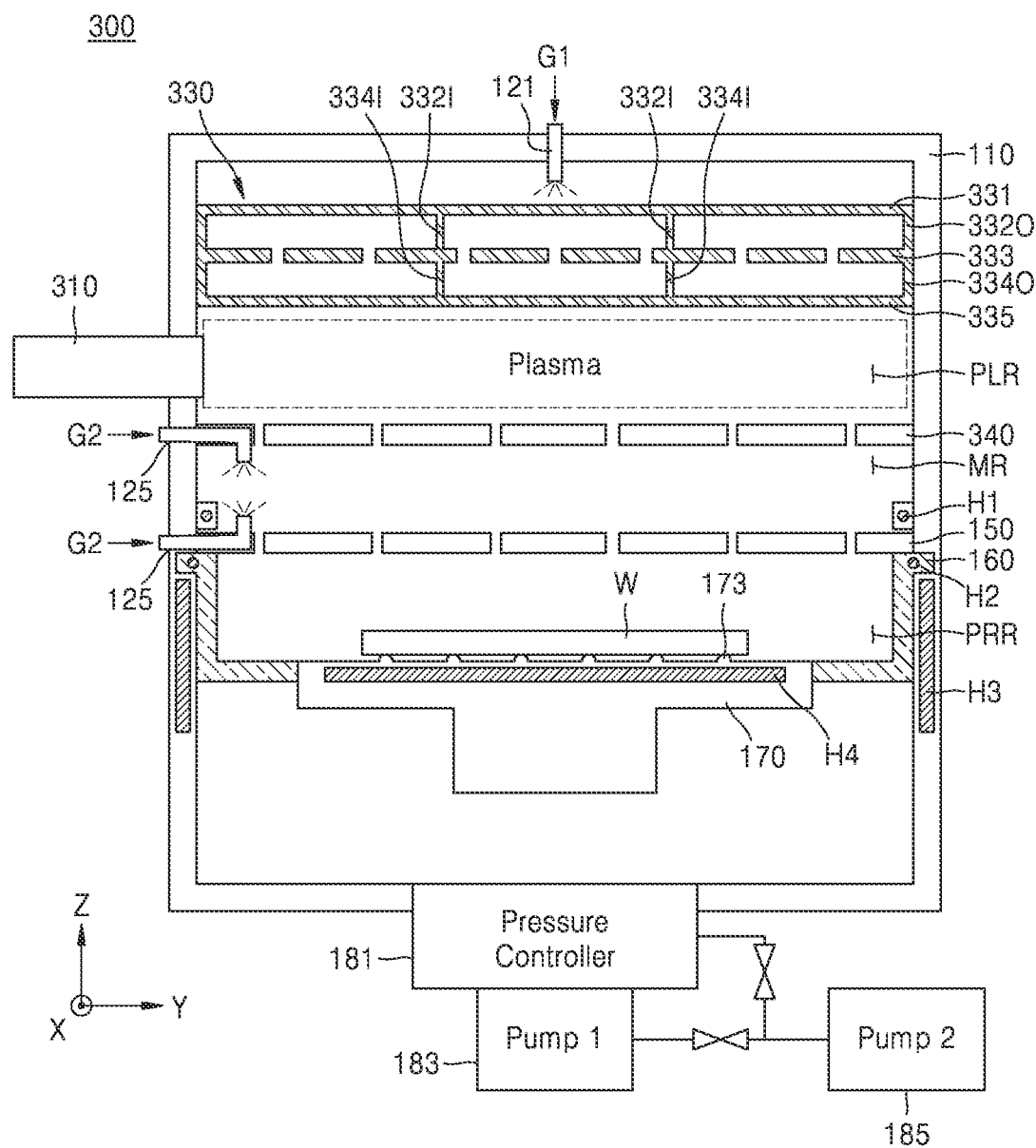
FIG. 9 illustrates a schematic cross-sectional view of a wafer processing apparatus according to other embodiments of the inventive concepts.

FIG. 9 illustrates a schematic cross-sectional view descriptive of a wafer processing apparatus 300 according to other embodiments of the inventive concepts.

For convenience, description which is the same as or similar to description provided with reference to FIGS. 1 to 2C is omitted, and the following description will mainly focus on differences between the embodiments of FIGS. 1 to 2C and FIG. 9.

Referring to FIG. 9, the wafer processing apparatus 300 may include a chamber body 110, a first process gas supply device 121, a second process gas supply device 125, a waveguide 310, first and second gas distribution structures 330 and 340, a showerhead 150, a liner 160, a wafer supporter 170, first to fourth heaters H1 to H4, an automatic pressure controller 181, and first and second pumps 183 and 185.

The wafer processing apparatus 100 may include micro plasma equipment. The wafer processing apparatus 300 in FIG. 9 is similar to the wafer processing apparatus 100 of FIG. 1, but does not include the upper electrode 130, the lower electrode 140, and the RF power source 190, and additionally includes the waveguide 310 and the first and second gas distribution structures 330 and 340.

The first and second gas distribution structures 330 and 340 may be substantially the same as the first and second gas distribution structures 230 and 240 of FIG. 8.

The waveguide 310 may transfer microwave power, generated outside or externally of the wafer processing apparatus 300, to the plasma region PLR. The microwave power transferred by the waveguide 310 may be generated by, for example, a patch antenna, a dipole antenna, a monopole antenna, a micro strip antenna, a slot antenna, a Yagi antenna, etc. According to embodiments, plasma may be generated from an external microwave power source, and thus, an RF power source (see 190 of FIG. 1) may be omitted.

Figure 10:
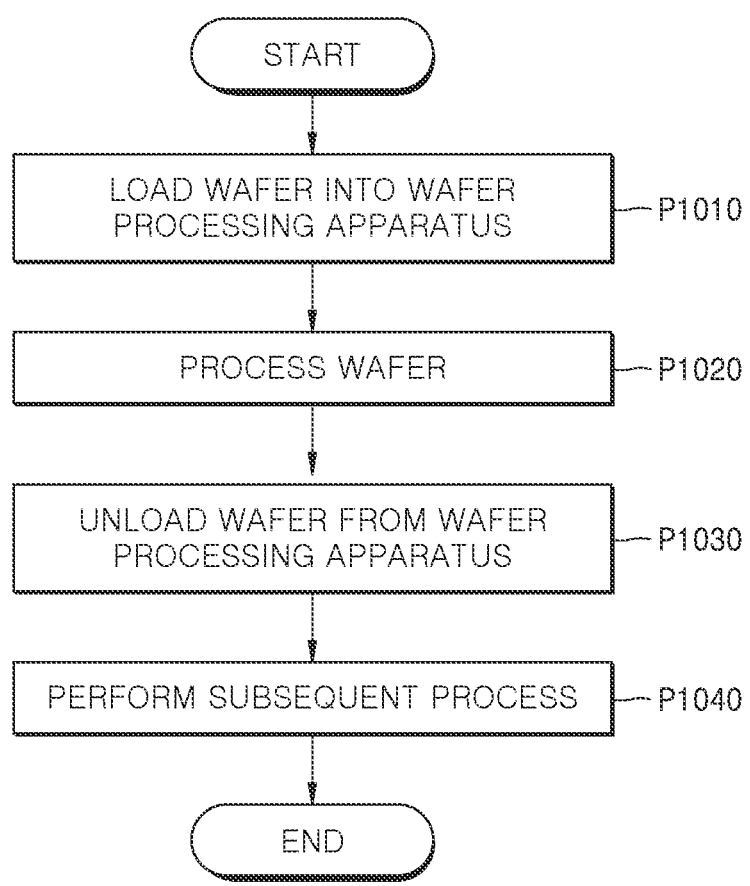
FIG. 10 illustrates a flowchart descriptive of a method of manufacturing a semiconductor device according to embodiments of the inventive concepts.

FIG. 10 illustrates a flowchart descriptive of a method of manufacturing a semiconductor device, according to embodiments of the inventive concepts.

Referring to FIGS. 1 and 8 to 10, in operation P1010, a wafer W is loaded to the wafer processing apparatus 100, 200, or 300.

The wafer W may include, for example, silicon (Si). The wafer W may include, for example, a semiconductor element such as germanium (Ge) or a compound semiconductor such as silicon carbide (SiC), gallium arsenide (GaAs), indium arsenide (InAs), or indium phosphide (InP). According to some embodiments, the wafer W may have a silicon on insulator (SOI) structure. The wafer W may include a buried oxide layer. According to some embodiments, the wafer W may include a conductive region (for example, an impurity-doped well). According to some embodiments, the wafer W may have various isolation structures such as shallow trench isolation (STI) for isolating the doped well. The wafer W may include a first surface, which is an active surface, and a second surface which is an inactive surface opposite to the first surface. The wafer W may be disposed on the wafer supporter 170 so that the second surface is opposite to the wafer supporter 170.

The wafer W may include a wafer on which a series of processes have been performed. A series of processes capable of being performed on the wafer W may include i) an oxidation process of forming oxide, ii) a lithography process including a spin coating process, an exposure process, and a development process, iii) a thin film deposition process, iv) a dry or wet etching process, and v) a metal wiring process.

The oxidation process may be a process of forming thin and uniform silicon oxide by performing a chemical reaction between oxygen or vapor and a silicon substrate surface at a high temperature of about 800 degrees C. to about 1,200 degrees C. The oxidation process may include a dry oxidation process and a wet oxidation process. The dry oxidation process may form oxide by reacting oxygen and gas, and the wet oxidation process may form oxide by reacting oxygen and vapor.

According to some embodiments, an SOI structure may be formed on a substrate by the oxidation process. The substrate may include a buried oxide layer. According to some embodiments, the substrate may have various isolation structures such as STI.

The lithography process may be a process of transferring a circuit pattern, previously formed on a lithography mask, to the substrate through exposure. The lithography process may be performed in the order of the spin coating process, the exposure process, and the development process.

The thin film deposition process may include, for example, one of an atomic layer deposition (ALD) process, a chemical vapor deposition (CVD) process, a plasma-enhanced CVD (PECVD) process, a metal organic CVD (MOCVD) process, a physical vapor deposition (PVD) process, a reactive pulsed laser deposition process, a molecular beam epitaxy process, and a DC magnetron sputtering process.

The dry etching process may include, for example, one of a reactive ion etching (RIE) process, a deep RIE (DRIE) process, an ion beam etching (IBE) process, and an Ar milling process. As another example, the dry etching process performed on the wafer W may be an atomic layer etching (ALE) process. Also, the wet etching process performed on the wafer W may be an etching process using, as an etchant gas, at least one of for example $Cl_2$, HCl, $CHF_3$, $CH_2F_2$, $CH_3F$, $H_2$, $BCL_3$, $SiCl_4$, $Br_2$, HBr, $NF_3$, $CF_4$, $C_2F_6$, $C_4F_8$, $SF_6$, $O_2$, $SO_2$, and COS.

The metal wiring process may be a process of forming a conductive wiring (a metal line), for implementing a circuit pattern for an operation of a semiconductor device. Transfer paths for transferring a ground voltage, power, and a signal for operating semiconductor devices may be formed by the metal wiring process. The metal wiring may include gold, platinum, silver, aluminum, and tungsten.

According to some embodiments, an ion injection process and a planarization process such as a chemical mechanical polish (CMP) process may be performed in a process of manufacturing a semiconductor device.

The wafer W may be transported by a transport apparatus including a precise clean room transport system. The transport apparatus may include a conveyer system and the like. The transport apparatus may load the wafer W to the wafer processing apparatus 100, 200, or 300. Depending on the case, the transport apparatus may load the wafer W to a load port adjacent to the wafer processing apparatus 100, 200, or 300, and the wafer W may be loaded to the wafer processing apparatus 100, 200, or 300 by a separate robot arm.

Subsequently, in operation P1020, the wafer W may be processed. The processing of the wafer W is as described above with reference to FIGS. 3 to 7.

After the processing of the wafer W is completed, the wafer W may be unloaded from the wafer processing apparatus 100, 200, or 300 in operation P1030. The unloaded wafer W may be applied to equipment for a subsequent process in operation P1040. The subsequent process may include for example an oxidation process, a lithography process, a thin film deposition process, a dry or wet etching process, and a metal wiring process, and moreover, may include an EDS process, a packaging process, and a package test process, among other processes.

The EDS process may denote a process of applying an electrical signal to semiconductor devices formed on the wafer W, and determining the occurrence or not of a defect of the semiconductor devices on the basis of a signal which is output from each of the semiconductor devices responsive to the applied electrical signal.

The packaging process may include for example a wafer back grinding process, a wafer sawing process, a die attach process, a wire bonding process, a molding process, a marking process, a solder ball mount process, and an individualization process, among other processes.

The package test may include for example an assembly output test, a direct current (DC) test, a burn-in test, a monitoring burn-in test, a post burn-in test, and a final test, among other tests.

While the inventive concepts have been particularly shown and described with reference to embodiments thereof, it should be understood that various changes in form and detail may be made therein without departing from the spirit and scope of the following claims.

What is claimed is:

1. A method of manufacturing a semiconductor device, the method comprising:
    loading a wafer into a wafer processing apparatus; and
    processing the wafer in the wafer processing apparatus,
    wherein the processing the wafer comprises
        supplying a first process gas into the wafer processing apparatus using a shower head,
        generating plasma using the first process gas,
        supplying a second process gas using the shower head and mixing the second process gas with the plasma,
        performing, at an first internal pressure of the wafer processing apparatus, a plasma process on the wafer using the plasma and the second process gas at a first temperature, and
        performing, at a second internal pressure of the wafer processing apparatus less than the first internal pressure, an annealing process on the wafer at a second temperature higher than the first temperature after the performing the plasma process,
    wherein the temperature of the wafer is determined by the difference between a heat gain of the wafer by a radiant heat from the showerhead and a heat loss of the wafer by heat convection by an internal atmosphere of the wafer processing apparatus, and
    wherein the temperature of the wafer is decreased to the first temperature by increasing the internal pressure of the wafer processing apparatus to the first pressure to increase the heat loss by the heat convection between the wafer and the first and second process gases, and
    the temperature of the wafer is increased to the second temperature by decreasing the internal pressure of the wafer processing apparatus to the second pressure to decrease the heat loss by the heat convection between the wafer and the first and second process gases.

2. The method of claim 1, wherein the first temperature ranges from 25° C. to 110° C.

3. The method of claim 1, wherein the first pressure ranges from 0.1 Torr to 10 Torr.

4. The method of claim 1, wherein an RF (Radio Frequency) power is provided during the performing of the annealing process, and
    the RF power is turned off during the performing of the annealing process.

5. The method of claim 1, wherein a duration time of the performing the annealing process is greater than or equal to a duration time of the performing the plasma process.

6. The method of claim 1, wherein the performing the annealing process and the performing the plasma process are continuously performed alternately in-situ.

7. The method of claim 1, wherein the first process gas comprises $NF_3$, and the second process gas comprises $NH_3$.

8. A wafer processing method comprising:
    supplying a first process gas including fluorine (F) to a wafer processing apparatus using a shower head;
    applying radio frequency (RF) power to the first process gas to generate plasma;
    performing, at an first internal pressure of the wafer processing apparatus, a plasma process on a wafer in the wafer processing apparatus using the plasma at a first temperature; and
    performing, at a second internal pressure of the wafer processing apparatus less than the first internal pressure, an annealing process on the wafer at a second temperature higher than the first temperature after the performing the plasma process,
    wherein the performing the plasma process on the wafer and the performing the annealing process on the wafer are alternately and repeatedly performed in the wafer processing apparatus in-situ,
    wherein the temperature of the wafer is determined by the difference between a heat gain of the wafer by a radiant heat from the showerhead and a heat loss of the wafer by heat convection by an internal atmosphere of the wafer processing apparatus, and
    wherein the temperature of the wafer is decreased to the first temperature by increasing the internal pressure of the wafer processing apparatus to the first pressure to increase the heat loss by the heat convection between the wafer and the first and second process gases, and
    the temperature of the wafer is increased to the second temperature by decreasing the internal pressure of the wafer processing apparatus to the second pressure to decrease the heat loss by the heat convection between the wafer and the first and second process gases.

9. The wafer processing method of claim 8, wherein the temperature of the wafer is decreased to the first temperature by increasing the internal pressure of the wafer processing apparatus to the first pressure to increase heat convection between the wafer and the first process gas, and
    the temperature of the wafer is increased to the second temperature by decreasing the internal pressure of the wafer processing apparatus to the second pressure to decrease the heat convection between the wafer and the first process gas.

10. The wafer processing method of claim 9, wherein the first temperature ranges from 25° C. to 110° C.

11. The wafer processing method of claim 8, wherein the first pressure ranges from 0.1 Torr to 10 Torr.

12. The wafer processing method of claim 8, wherein a duration time of the performing the annealing process is greater than or equal to a duration time of the performing the plasma process.

13. A wafer processing method comprising:
    generating plasma in a wafer processing apparatus using $NF_3$ using a shower head;

performing, at an first internal pressure of the wafer processing apparatus, a plasma process on a wafer in the wafer processing apparatus using the generated plasma at a first temperature; and performing, at a second internal pressure of the wafer processing apparatus less than the first internal pressure, an annealing process on the wafer at a second temperature higher than the first temperature, wherein the performing the plasma process on the wafer and the performing the annealing process on the wafer are alternately and repeatedly performed in the wafer processing apparatus, wherein the temperature of the wafer is determined by the difference between a heat gain of the wafer by a radiant heat from the showerhead and a heat loss of the wafer by heat convection by an internal atmosphere of the wafer processing apparatus, wherein the temperature of the wafer is decreased to the first temperature by increasing the internal pressure of the wafer processing apparatus to the first pressure to increase the heat loss by the heat convection between the wafer and the first and second process gases, and the temperature of the wafer is increased to the second temperature by decreasing the internal pressure of the wafer processing apparatus to the second pressure to decrease the heat loss by the heat convection between the wafer and the first and second process gases.

14. The wafer processing method of claim 13, wherein the temperature of the wafer is decreased to the first temperature by increasing the internal pressure of the wafer processing apparatus to the first pressure to increase heat convection between the wafer and the first process gas, and the temperature of the wafer is increased to the second temperature by decreasing the internal pressure of the wafer processing apparatus to the second pressure to decrease the heat convection between the wafer and the first process gas.

15. The wafer processing method of claim 13, wherein the performing the plasma process comprises substituting silicon oxide, which is on the wafer, with a by-product, and the performing the annealing process comprises removing the by-product generated by the performing the plasma process.

16. The wafer processing method of claim 15, wherein the second temperature is higher than a sublimation temperature of the by-product.

17. The wafer processing method of claim 13, wherein a duration time of the performing the annealing process is greater than or equal to a duration time of the performing the plasma process.

* * * * *